US007543254B2

(12) United States Patent
Xu et al.

(10) Patent No.: US 7,543,254 B2
(45) Date of Patent: Jun. 2, 2009

(54) METHOD AND APPARATUS FOR FAST IDENTIFICATION OF HIGH STRESS REGIONS IN INTEGRATED CIRCUIT STRUCTURE

(75) Inventors: Xiaopeng Xu, Cupertino, CA (US); Dipankar Pramanik, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 375 days.

(21) Appl. No.: 11/530,372

(22) Filed: Sep. 8, 2006

(65) Prior Publication Data

US 2008/0066023 A1    Mar. 13, 2008

(51) Int. Cl.
*G06F 17/50* (2006.01)
(52) U.S. Cl. .............................. 716/4; 716/5
(58) Field of Classification Search ................. 716/4, 716/6
See application file for complete search history.

(56) References Cited

U.S. PATENT DOCUMENTS 4,753,901 A * 6/1988 Ellsworth et al. ........... 438/427
5,675,521 A * 10/1997 Holzhauer et al. ............ 716/20
7,337,420 B2 * 2/2008 Chidambarrao et al. ........ 716/8

OTHER PUBLICATIONS

Ogunjimi, A.O., et al. "A Comparison of Modelling Methods for Electronic Interconnect Structures," IEEE Proceedings of 43rd Electronic Components and Technology Conference Jun. 1993, 871-876.

* cited by examiner

*Primary Examiner*—Jack Chiang
*Assistant Examiner*—Brandon W Bowers
(74) *Attorney, Agent, or Firm*—Warren S. Wolfeld; Haynes Beffel & Wolfeld LLP

(57) ABSTRACT

Roughly described, high-stress volumetric regions of an integrated circuit structure are predicted by first scanning one or more layout layers to identify planar regions of high 2-dimensional stress, and then performing the much more expensive 3-dimensional stress analysis only on volumetric regions corresponding to those planar regions that were found to have high 2-dimensional stress. A windowing method can be used for the 2-dimensional scan, optionally with an overlap region extending slightly into adjacent windows. Very narrow features arising at the edges of an analysis window can be relocated to the edge of the analysis window in order to avoid numerical artifacts.

24 Claims, 12 Drawing Sheets

METHOD AND APPARATUS FOR FAST IDENTIFICATION OF HIGH STRESS REGIONS IN INTEGRATED CIRCUIT STRUCTURE

BACKGROUND AND SUMMARY OF THE INVENTION

The present invention relates to stress analysis of integrated circuits, and more particularly, to fast techniques for identifying high-stress regions.

A typical integrated circuit device includes a number of interconnect layers alternating with dielectric layers, all superposing a silicon substrate. Many of the dielectric layers are also referred to as via layers, because they include holes, or vias, in specific locations to allow the formation of conductive material passing from one interconnect layer to another, or from one interconnect layer to a desired point on the substrate. The material in the via connects above to a conducting trace and below to either another conducting trace or to the substrate.

Material property mismatch between the interconnect material and the dielectric material often introduces thermal mismatch stress in the interconnect structures. Stresses can also arise from other sources such as intrinsic/grain growth, and residual stress can exist from previous process steps. High stress in localized regions, such as the region between two line ends or at vias, can lead to yield or field failures from dielectric cracking, interface de-bonding, or metal voiding. This problem has increased in significance with the adoption of low-k dielectric materials, which typically have lower mechanical strength than the more traditional dielectric materials, although it can arise with the traditional materials as well.

Because of the large amount of time and expense required to fabricate prototypes of integrated circuits for testing, it has become commonplace to extensively simulate integrated circuits at various stages in the process of converting the basic circuit design to the mask reticles or other representations ultimately used in the fabrication process. For mechanical stress distribution, simulations are usually performed based on the integrated circuit layout data. But since stress failure due to inter-layer material property mismatches is inherently a 3-dimensional problem, 3-dimensional stress analysis of volumetric (3-dimensional) regions of the device was typically required. Such analysis was typically performed using a 3-dimensional finite element analysis, which is exceedingly time consuming. It is prohibitive to analyze large layouts using this method. As a result, the design and technology community is not currently able to fully analyze large layouts for mechanical stress performance based on layout data.

It has now been recognized that because of the specific geometry and material composition of logic based interconnects, there is a strong correlation between high stress distributions on a 2-dimensional layout plane and that in the 3-dimensional interconnect structure defined by the 2-dimensional layout. In addition, it has been recognized that the analysis window for a 2-dimensional analysis can be quite small around the structures. Based on these insights and others a high performance stress analyzer can be developed which can allow a large design layout to be analyzed. Roughly described, the analyzer first scans layout layers with a 2-dimensional stress analyzer, to predict regions of high 2-dimensional stress. 3-dimensional structures corresponding to those 2-dimensional regions can then be further analyzed locally with a 3-dimensional stress simulator for more accurate volume stress distributions. The 2-dimensional analysis is much simpler and much quicker than a 3-dimensional analysis, and can greatly reduce the number and size of volumetric regions for 3-dimensional analysis. As a result, it is now practical to analyze the layout for an entire chip for high stress regions, and to do so much more quickly than was previously required to perform a 3-dimensional analysis on only a small part of the chip layout.

Although a 2-dimensional stress calculation of a planar region is known to approximate a full 3-dimensional stress calculation when either the third dimension (e.g. depth) is sufficiently small or there is little geometric variation in the third dimension, interconnect and via layers of modern-day devices typically are not so thin compared to their feature widths, and layout details vary from layer to layer. In addition, it can be seen from the above that stress-related integrated circuit reliability issues often arise from structures that extend deeply into the device, spanning multiple layers. Embodiments described herein do not necessarily approximate the 3-dimensional stress components from the 2-dimensional analysis; rather they use the 2-dimensional analysis to point to those 3-dimensional regions to be analyzed further for their 3-dimensional stress components.

BRIEF DESCRIPTION OF THE DRAWINGS

The invention will be described with respect to specific embodiments thereof, and reference will be made to the drawings, in which.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
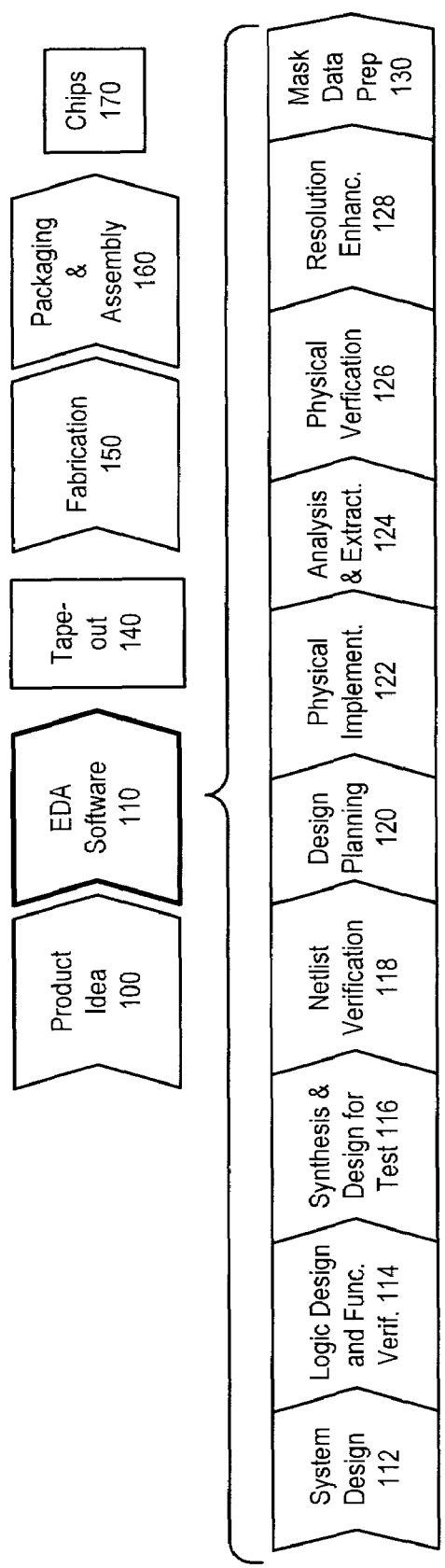
FIG. 1 shows a simplified representation of an illustrative digital integrated circuit design flow.

FIG. 1 shows a simplified representation of an illustrative digital integrated circuit design flow. At a high level, the process starts with the product idea (step 100) and is realized in an EDA (Electronic Design Automation) software design process (step 110). When the design is finalized, it can be taped-out (step 140). After tape out, the fabrication process (step 150) and packaging and assembly processes (step 160) occur resulting, ultimately, in finished integrated circuit chips (result 170).

The EDA software design process (step 110) is actually composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (step 110) will now be provided.

System design (step 112): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that produces the correct outputs in response to particular input stimuli. Example EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 120): Here, an overall floor plan for the chip is constructed and analyzed for timing and top-level routing. Example EDA software products from Synopsys, Inc. that can be used at this step include Astro and IC Compiler products.

Physical implementation (step 122): The placement (positioning of circuit elements) and routing (connection of the same) occurs at this step. Example EDA software products from Synopsys, Inc. that can be used at this step include the Astro and IC Compiler products.

Analysis and extraction (step 124): At this step, the circuit function is verified at a transistor level, this in turn permits what-if refinement. Example EDA software products from Synopsys, Inc. that can be used at this step include AstroRail, PrimeRail, Primetime, and Star RC/XT products.

Physical verification (step 126): At this step various checking functions are performed to ensure correctness for: manufacturing, electrical issues, lithographic issues, and circuitry. Example EDA software products from Synopsys, Inc. that can be used at this step include the Hercules product. Certain aspects of the invention can be applied during this step.

Resolution enhancement (step 128): This step involves geometric manipulations of the layout to improve manufacturability of the design. Example EDA software products from Synopsys, Inc. that can be used at this step include Proteus, ProteusAF, and PSMGen products.

Mask data preparation (step 130): This step provides the "tape-out" data for production of masks for lithographic use to produce finished chips. Example EDA software products from Synopsys, Inc. that can be used at this step include the CATS(R) family of products.

Figure 2:
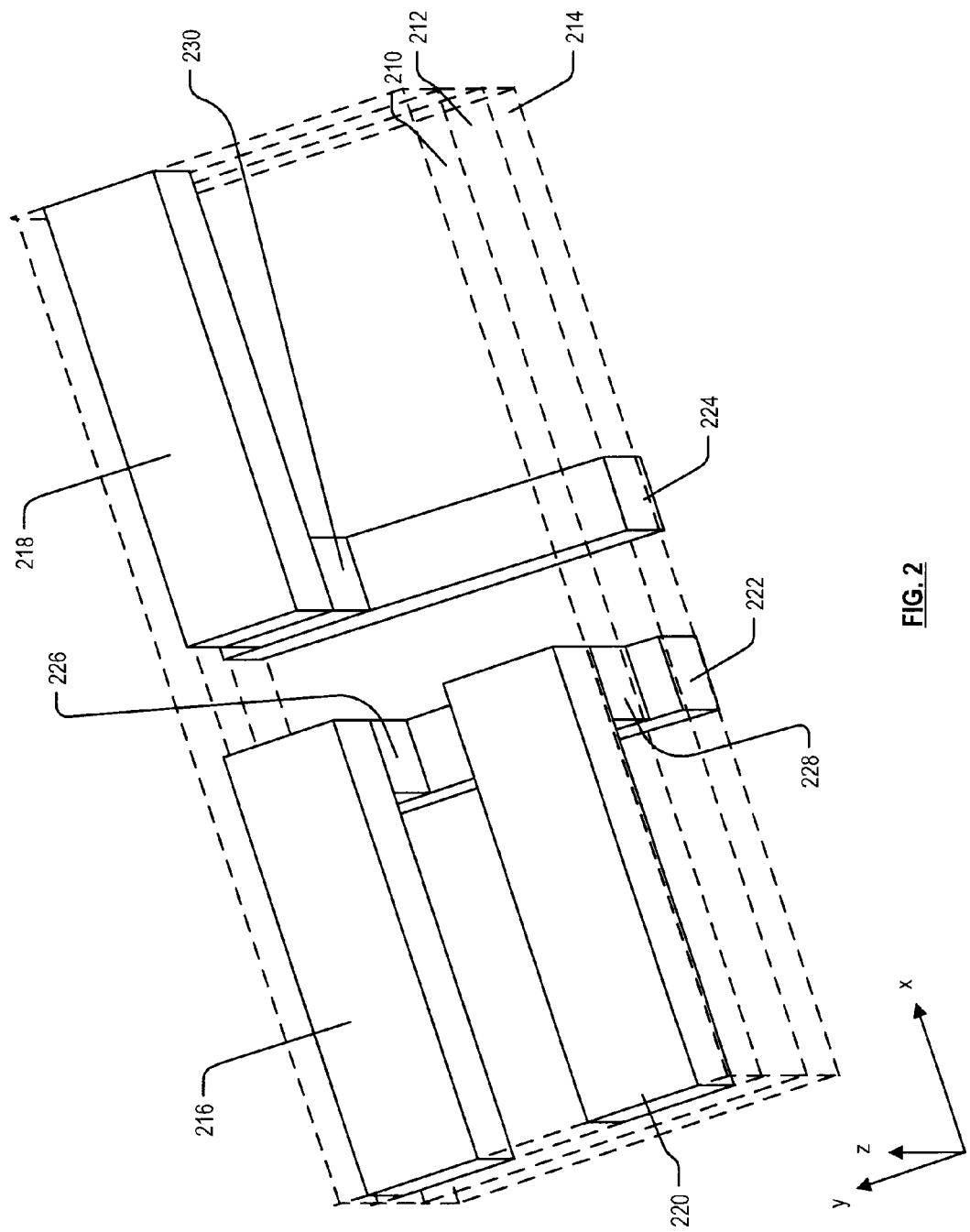
FIG. 2 shows a small 3-dimensional volume of typical integrated circuit logic.

FIG. 2 shows a small 3-dimensional volume of typical integrated circuit logic which includes three adjacent layers of the device: a top interconnect layer 210, an intermediate dielectric layer 212 below the interconnect layer 210, and a bottom interconnect layer 214 below the dielectric layer 212. Other layers may exist above and/or below the three layers shown. The structure in the drawing includes three metal traces 216, 218 and 220 in the top interconnect layer 210, all oriented in the x-direction, and two metal traces 222 and 224 in the bottom interconnect layer 214, both oriented in the y-direction. The trace 216 is in-line with but longitudinally spaced from the trace 218. The trace 220 is parallel to the trace 216, and terminates at about the same x-position as trace 216. The trace 222 crosses under the termination regions of both traces 216 and 220, and the trace 224 crosses under the termination region of trace 218. A metalized via 226 connects trace 216 vertically to trace 222. Similarly, another metalized via 228 connects trace 220 vertically to trace 222, and another metalized via 230 connects trace 218 vertically to trace 224. Structures like that shown in FIG. 2 are not uncommon in integrated circuit devices, especially in integrated circuit logic devices. In the embodiment of FIG. 2, the metal traces are primarily copper, and the dielectric is a low-k dielectric material.

FIG. 2 shows a volumetric region of the device. As used herein, a "volumetric region" is a region having a length, width and depth. It is distinguished from a "planar region", which has only a length and a width. A planar region can be defined by its location and dimensions in a plan view alone. A planar region may also be a planar surface of a volumetric region.

3-dimensional stress, as the term is used herein, is stress acting on a volumetric region. Typically it includes six components denoted herein as $\sigma_{ij}$, which is the stress in the j direction acting on the face normal to the i direction. In the absence of body moments, the stress tensor is symmetric so $\sigma_{ij}$ is equal to $\sigma_{ji}$. The directions i and j are denoted herein as x, y and z, but in another common notation the directions are denoted as 1, 2 and 3. The six 3-dimensional stress components are $\sigma_{xx}$, $\sigma_{xy}$, $\sigma_{xz}$, $\sigma_{yy}$, $\sigma_{yz}$ and $\sigma_{zz}$. The components $\sigma_{xx}$, $\sigma_{yy}$, and $\sigma_{zz}$ are sometimes referred to herein as "normal" stress components, because they represent the stress components that act normal to the faces of the region. The components $\sigma_{xy}$, $\sigma_{xz}$, and $\sigma_{yz}$ are sometimes referred to herein as "shear" stress components, because they act in a direction parallel to a subject face of the region. Three additional stress components $\sigma_{yx}$, $\sigma_{zx}$ and $\sigma_{zy}$ are equal to $\sigma_{xy}$, $\sigma_{xz}$ and $\sigma_{yz}$, respectively (again assuming no body moments), and therefore need not be calculated or specified when describing the 3-dimensional stress of a particular volumetric region. Note also that $\sigma_{xx}$, $\sigma_{yy}$, and $\sigma_{zz}$ are sometimes abbreviated herein as $\sigma_x$, $\sigma_y$, and $\sigma_z$.

As can be seen in FIG. 2, the layers of the physical device are not planar. They have a substantial thickness, they may rise and fall with contours of other layers below, and the dielectric layers in particular extend above and below into planes also occupied by the interconnect layers. But they nevertheless are considered layers herein, because they are defined by layout layers of an integrated circuit layout. A "layout layer" is defined by a mask to be used in fabricating the corresponding layer of the integrated circuit device, and the mask in turn is defined using a corresponding set of geometry information in a database. Although the geometry information in the database may not wholly define the ultimately formed integrated circuit layer, for example due to subsequent geometric processing and fabrication uncertainties, it is clearly distinguished in the database from the geometry information that defines other layers of the integrated circuit (except where the same layer geometry is used to fabricate more than one different layer in the ultimate device). A layer of the ultimately fabricated integrated circuit device thus corresponds to a "layout layer" in the integrated circuit layout, but differs from a layout layer in that the integrated circuit device layer is physical and the layout layer is only a numerical representation of certain geometries that will be formed in the corresponding physical layer. The simulations performed in embodiments of the invention described herein are performed on the layout information, not the physical layers of the device. Thus they can be said to predict regions of high stress in the actual device.

Overall Process Flow

Figure 3:
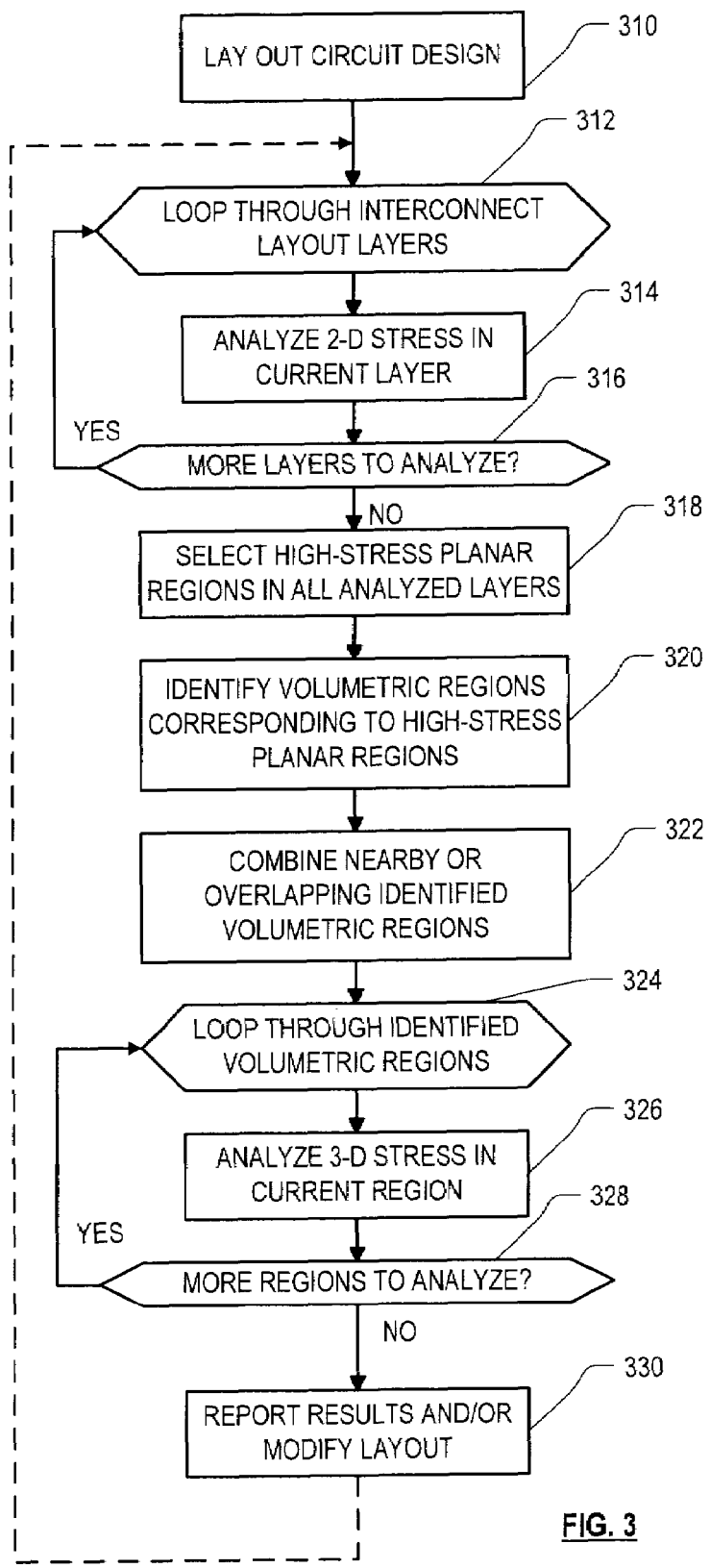
FIG. 3 is a flow chart illustrating the overall flow of a method and system incorporating an embodiment of the invention.

FIG. 3 is a flow chart illustrating the overall flow of a method and system incorporating an embodiment of the invention. As in all flowcharts herein, it will be appreciated that many of the steps can be interchanged in sequence with other steps, are performed in parallel with other steps, without changing the overall functions achieved.

The flowchart begins in step 310 with a laying out of a circuit design. Roughly, this corresponds to step 122 (FIG. 1). The layout step produces a layout database (which may be represented in one or more files or in one or more data streams or both), which defines the geometry for each of the various layers that will be used in the manufacture of the integrated circuit device. The database may be in the well-known GDS II format, for example, the OASIS format, or any other format which defines layered geometries. The layers defined in the database are ultimately used to create masks or to control direct writing of a physical integrated circuit device, but not all such layers will ultimately appear on the final device. Some layers define sacrificial materials, for example, which are removed during a subsequent process step. In addition, not all layers that will appear on the ultimate device need be considered in the stress analysis method described herein. For example, very thin etch stop layers, dielectric capping layers and passivation layers often can be ignored. All the physical layers on the ultimate device which are considered in the stress analysis, however, are represented by a corresponding layout layer in the layout database.

In step 312, the system begins a loop through all of the interconnect layout layers represented in the file. For the 2-dimensional analysis, these are the only layers that need be analyzed in the present embodiment. Other embodiments, of course, can analyze other layers if desired.

In step 314, the system performs a 2-dimensional stress analysis of the current layer. As used herein, a 2-dimensional stress analysis considers only the tensor stress components acting in-plane, on a 2-dimensional (planar) region. Typically it includes three components denoted herein as $\sigma_{ij}$, which for 2-dimensional purposes is the stress in the j direction acting on the edge normal to the i direction. As in the 3-dimensional case the stress tensor is symmetric in the absence of body moments.

For the 2-dimensional analysis the directions i and j each can take on values x and y, but in another common notation they take on values 1 and 2 instead. Using the x,y notation, the three stress components that define 2-dimensional stress are $\sigma_{xx}$, $\sigma_{xy}$ and $\sigma_{yy}$. The components $\sigma_{xx}$ and $\sigma_{yy}$ are sometimes referred to herein as "normal" stress components, because they represent the stress component that acts normal to the x and y edges of the region, respectively. The component $\sigma_{xy}$ is sometimes referred to herein as a "shear" stress component because it acts in a direction parallel to the subject edge. Another shear stress component, $\sigma_{yx}$, is equal to $\sigma_{xy}$ (assuming no body moments) and therefore need not be calculated or specified when describing the 2-dimensional stress of a particular planar region.

Details and considerations of the 2-dimensional stress analysis step 314 are set forth hereinafter, but briefly, an embodiment of the process involves first imposing a polygon mesh over the 2-dimensional geometry of the layer, and then performing a finite element analysis to determine the three 2-dimensional stress components in each polygon defined by the mesh polygons. The tensor invariant principle stress is calculated for each polygon, and the principle stress value determined for each polygon is then averaged with that determined for nearby polygons, to develop an average principle stress value for each polygon in the mesh.

In step 316, if there are more layout layers to analyze, the system returns to step 312 to perform a 2-dimensional stress analysis on the next layer.

In step 318, after an average stress value is known for all of the mesh polygons in all of the interconnect layout layers, those polygons exhibiting the highest average 2-dimensional stress are selected for further analysis in three dimensions. As used herein, a "region of high 2-dimensional stress" is any region whose 2-dimensional stress values meet whatever the user's definition is of "high". At a minimum the stress in such a region must be higher than that in at least one other region, but otherwise the threshold of what defines a "region of high 2-dimensional stress" is wholly within the discretion of the user or automated process. In one embodiment, all the polygons exceeding a predetermined threshold average stress are selected in step 318, but in the embodiment of FIG. 3, only the N highest stress polygons are selected. N maybe a fixed number, and for example may be 20 or 50.

In step 320, a volumetric (3-dimensional) region of the layout is identified corresponding to each of the high stress planar regions selected in step 318. The size of the volumetric region that will be identified for a particular polygon depends on the estimated range of interaction for the particular combination of materials that will be used in the final device. For a typical device that will use copper interconnects and a low-k dielectric, the size of the volumetric region might be about 5 times the range, in each of the x and y directions, that was included in the averaging calculation in step 314. For example, if the averaging of the stress determined for nearby polygons in step 314 considered polygons within a square having a length 2 r on a side, then the lateral size and shape of the volumetric region identified in step 320 for that subject polygon might be a square, centered at the center of the subject polygon, and having a length 10 r on a side. If the averaging of the stress determined for nearby polygons in step 314 considered polygons within a circle of radius r centered at the center of the subject polygon, then the lateral size and shape of the volumetric region identified in step 320 for that subject polygon might be a circle of radius of 5 r centered at the center of the subject polygon. Vertically, the volume is typically defined to include the interconnect layer in which the current high stress polygon was found, and vertically up through the next higher interconnect layer (if one exists), and vertically down through the next lower interconnect layer (if one exists). Depending on material properties, larger or smaller volumetric regions might be chosen.

Optionally, in step 322, those volumetric regions identified in step 320 which overlap each other, or which are close enough to each other to be within some predetermined interaction range that depends on the materials to be used, are combined.

Now that a small number of relatively small size volumetric regions have been identified as being the most likely to contain higher 3-dimensional stress, a 3-dimensional analysis can now be performed in these regions without the need for a huge amount of processing time. Accordingly, in step 324, the system begins a loop through all of the identified volumetric regions. In step 326 the system proceeds to analyze the 3-dimensional stress in the current volumetric region, and in step 328, if there are more identified volumetric regions to analyze, the system returns to step 324 to analyze the next. If not, then in step 330 the system either reports the results of the 3-dimensional analysis of the identified volumetric regions, and/or the layout is modified in ways that are expected to reduce the stress in those regions found to have unacceptably high stress. If the layout is modified, then the system can return to step 312 to begin the 2-dimensional/3-dimensional analysis again, using the modified layout.

As previously mentioned, in step 318, an alternative to selecting the N highest stress planar regions is to select those planar regions whose 2-dimensional stress (or average 2-dimensional stress) exceeds some predetermined threshold. In that alternative embodiment, it is not necessary to complete the 2-dimensional analysis of all the layers before selecting high stress planar regions. Nor is it even necessary to complete the analysis of an entire single layer. In such an embodiment, steps 318 and optionally even step 320 can be performed inside the loop of step 312. Additionally, if the step 322 of combining nearby overlapping identified volumetric regions can be omitted, the full 3-dimensional analysis in step 326 of the identified volumetric regions can also be performed inside the loop of step 312. Other variations will be apparent to the reader.

Analyzing 2-Dimensional Stress

Figure 4:
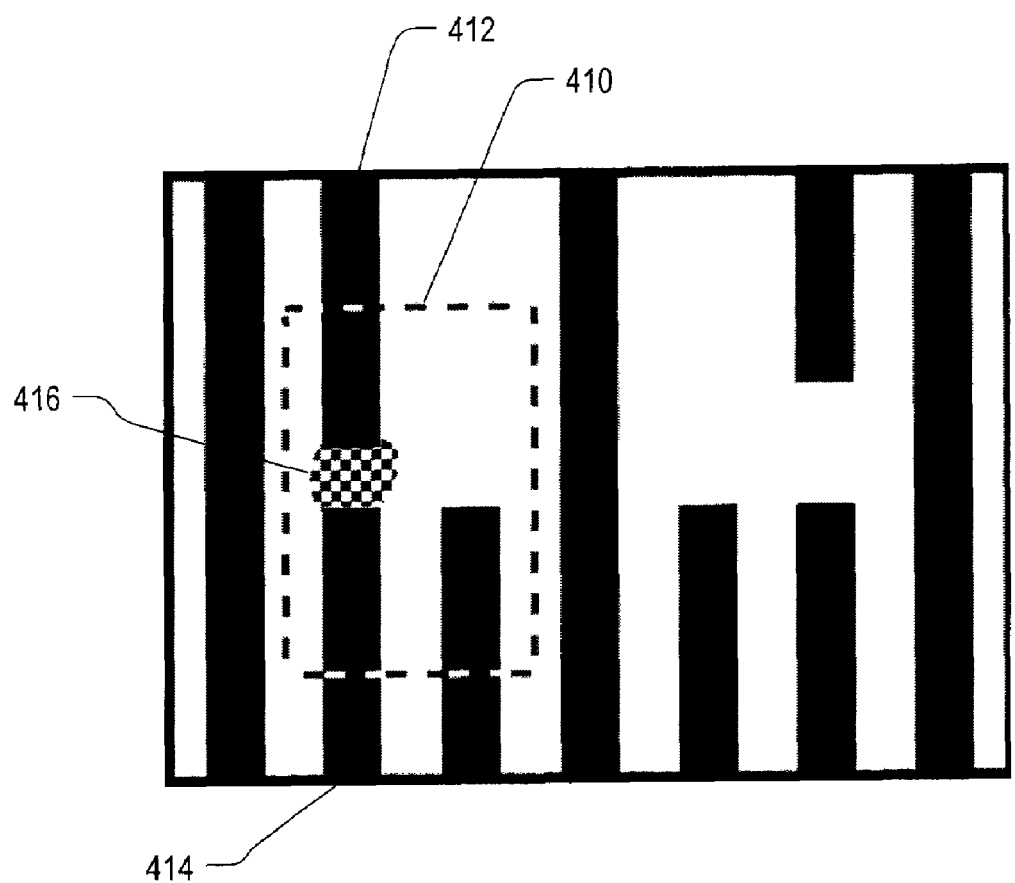
FIG. 4 illustrates some of the geometry indicated in the layout database for a small portion of the interconnect layer corresponding to one of the layers in FIG. 2.

The step 314 in FIG. 3 of analyzing 2-dimensional stress in a particular layer, can be performed in any of a number of different ways. In one embodiment, particular 2-dimensional geometric configurations are detected. For example, FIG. 4 illustrates some of the geometry indicated in the layout database for a small portion of the interconnect layer corresponding to layer 210 in FIG. 2. The black regions represent regions where metal is desired, and the white regions represent regions where non-metal is required. The region 410 bounded by the dotted line in FIG. 4 corresponds to the lateral surface of the volume of FIG. 2. It has been learned that places where two traces such as 412 and 414 in FIG. 4 are longitudinally spaced from each other by a small distance but are otherwise in-line with each other, are likely to exhibit high stress in the space between the two traces. In FIG. 4 this is indicated by the checkerboard area 416. Other detectable geometric configurations can also be identified for this purpose.

Figure 5:
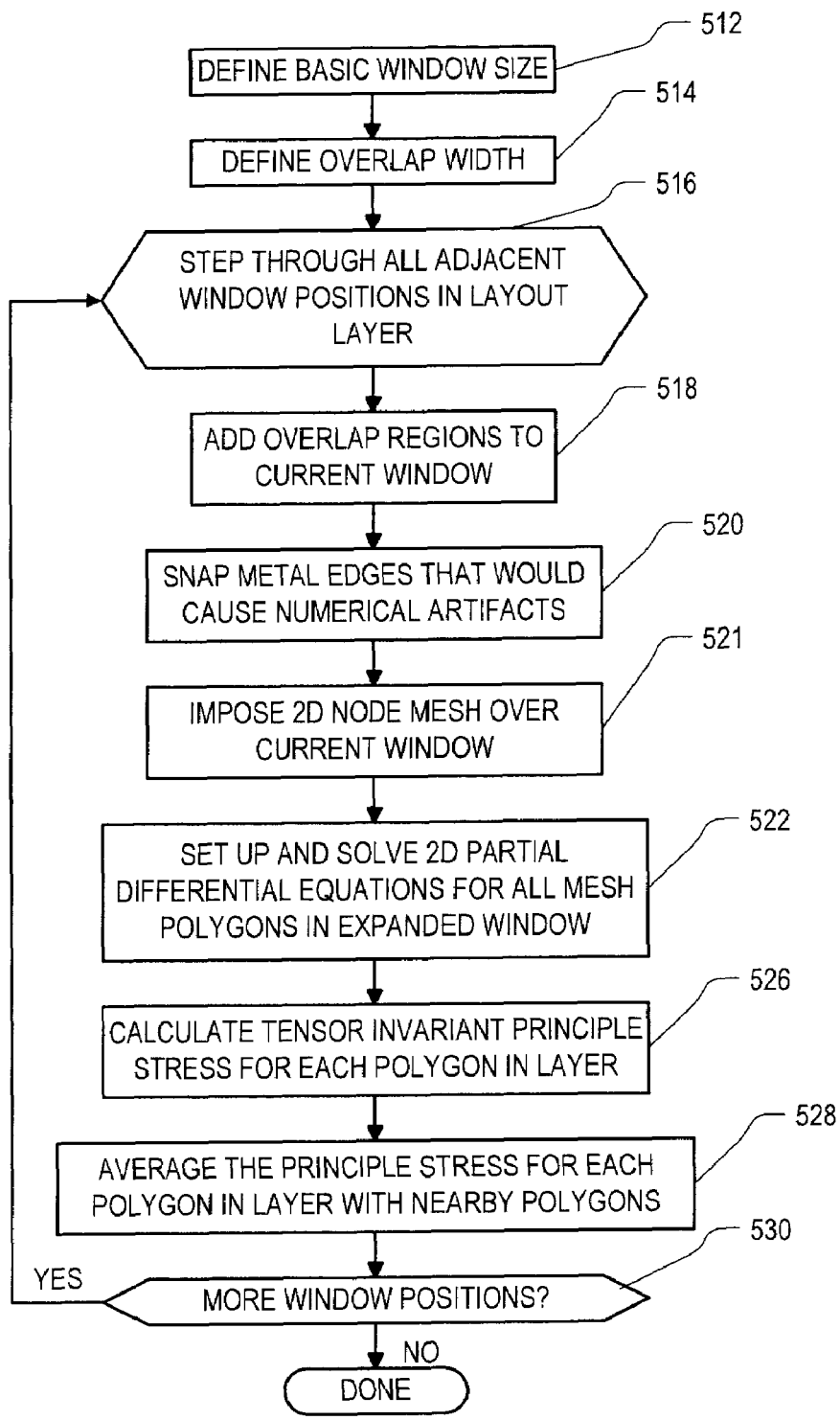
FIG. 5 is a flow chart detail of the step in FIG. 3 for analyzing 2-dimensional stress.

Preferably, however, instead of looking for specific geometric configurations, the 2-dimensional stress analysis is implemented using a 2-dimensional finite element analysis, and preferably but not necessarily, it is a windowed analysis in which only a small window on the current layer is analyzed at a time. FIG. 5 is a flow chart illustrating this technique.

In step 512, a basic window size and shape is defined. This step could instead be performed much earlier in the process, for example before the loop through the interconnect layers in step 312 (FIG. 3). The basic window size should be determined by considering several factors such as speed of the analysis, accuracy of the results, and cost of overhead. A small basic window size will produce results much more quickly, since fewer mesh regions will be included and fewer partial differential equations need be solved simultaneously. But it also risks missing some layout geometries that might have an effect on the stress within nearby windows. In addition, it increase the total cost due to window overlapping. Therefore, a typical basic window size might be, for example, a 10 um×10 um square. In one embodiment the basic window size is the same for all the interconnect layout layers, whereas in another embodiment it can be different for different interconnect layout layers.

Figure 6:
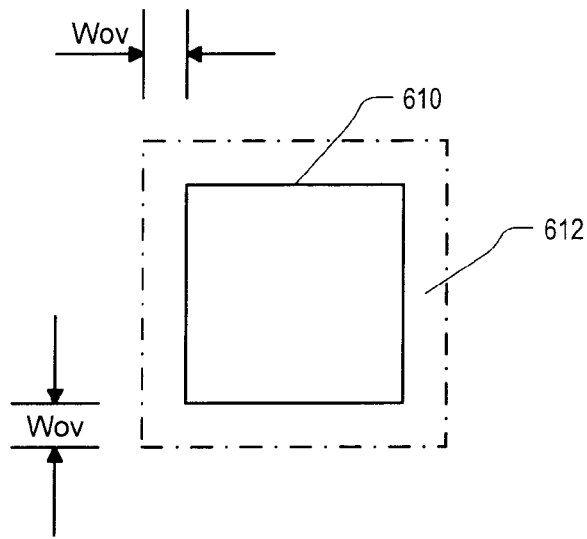
FIG. 6 shows a basic window and its overlap region, for purposes of a 2-dimensional windowed stress analysis.
Figure 7:
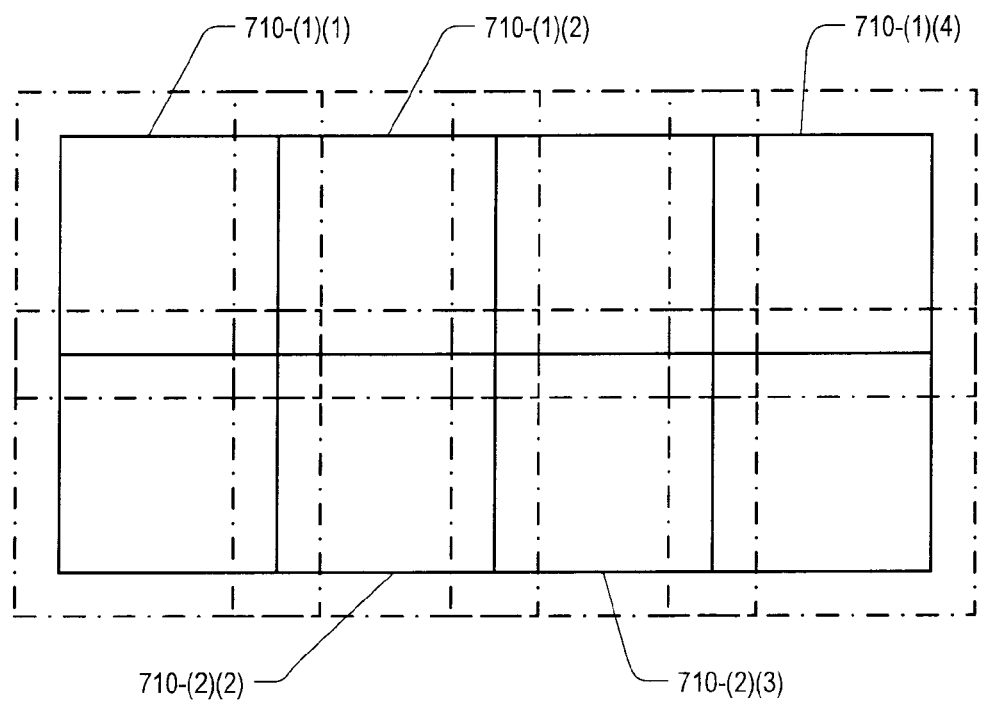
FIG. 7 shows a group of 8 basic window positions for purposes of a 2-dimensional windowed stress analysis.

Regardless of the basic window size chosen, there will be stress contributions from the materials in neighboring windows that will not be taken into account for mesh polygons in the current window unless special precautions are taken. In the present embodiment these are taken into account by overlapping the analysis windows as they are stepped across the layer. FIG. 6 shows a basic window 610 together with its overlap region 612, which as can be seen, is defined to extend out in all four directions beyond the edges of the basic window by an overlap width Wov. FIG. 7 illustrates a group of 8 stepped window positions. It can be seen that for each step the window is moved by the width of the basic window, so that the basic window positions are adjacent to each other, and the overlap region extends into all four adjacent window positions. Thus if the basic window positions are denoted 710-($i$)($j$), where i represents the horizontal index of window positions and j represents the vertical index of window positions, then the overlap region of each basic window position 710-($i$)($j$) extends partially into all of the basic window positions 710-($i$−1)($j$), 710-($i$)($j$−1), 710-($i$+1)($j$) and 710-($i$)($j$+1). It can be seen that within each basic window position, a border region equal to the width of the overlap regions will be processed twice: once when the current basic window is processed and once when its immediately adjacent basic window is processed. Corner portions within each basic window position will be processed four times. This duplicate processing represents overhead incurred by the use of overlap regions. A tradeoff therefore exists between the desire on one hand to choose the overlap width Wov as wide as possible to include all worst case scenarios, such as either large metal structures or a high density of metal structures just beyond the borders of the current basic window. On the other hand, it should be narrow enough so as to minimize the duplicate processing overhead that will be performed within the overlap regions. In a typical embodiment the overlap width Wov may be set at twice the minimum metal line width "Wmm" defined for the particular process technology that will be used to form the metal traces in the current layer.

The overlap width is defined in step 514 of FIG. 5, but as with the basic window size, it could instead be defined much earlier in the process. Also like the basic window size, different overlap widths can be defined for different interconnect layers in a particular embodiment. In step 516 the system begins a loop stepping through all the adjacent window positions in two dimensions in the current layout layer. In step 518, the overlap region is added to the current basic window.

Geometry that lies within the overlap region of a particular basic window position will be included in the 2-dimensional analysis for the particular basic window position. However, it has been discovered that certain geometric configurations in the overlap region can introduce false numerical artifacts in the stress calculations for the particular basic window. Specifically, it has been determined that metal regions and dielectric regions in the overlap region, which are narrower than the minimum line width for the current layer, can cause such artifacts. Accordingly, in order to avoid numerical artifacts, in step 520, the system repositions or "snaps" certain metal edges in the overlap region out to the outer edge of the overlap region.

Figure 8A:
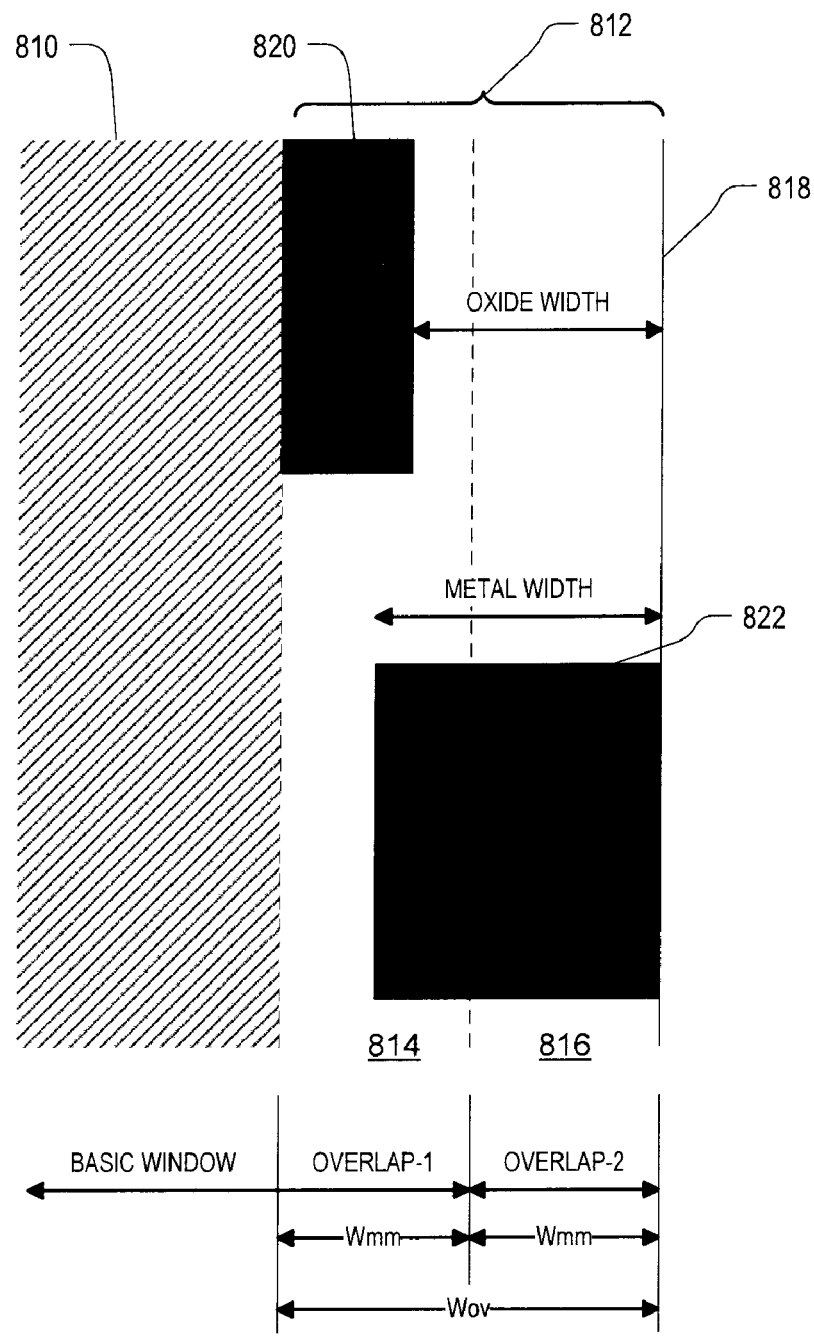
FIGS. 8A-8C illustrate metal regions in the overlap region of a window for use in a 2-dimensional windowed stress analysis.
Figure 8B:
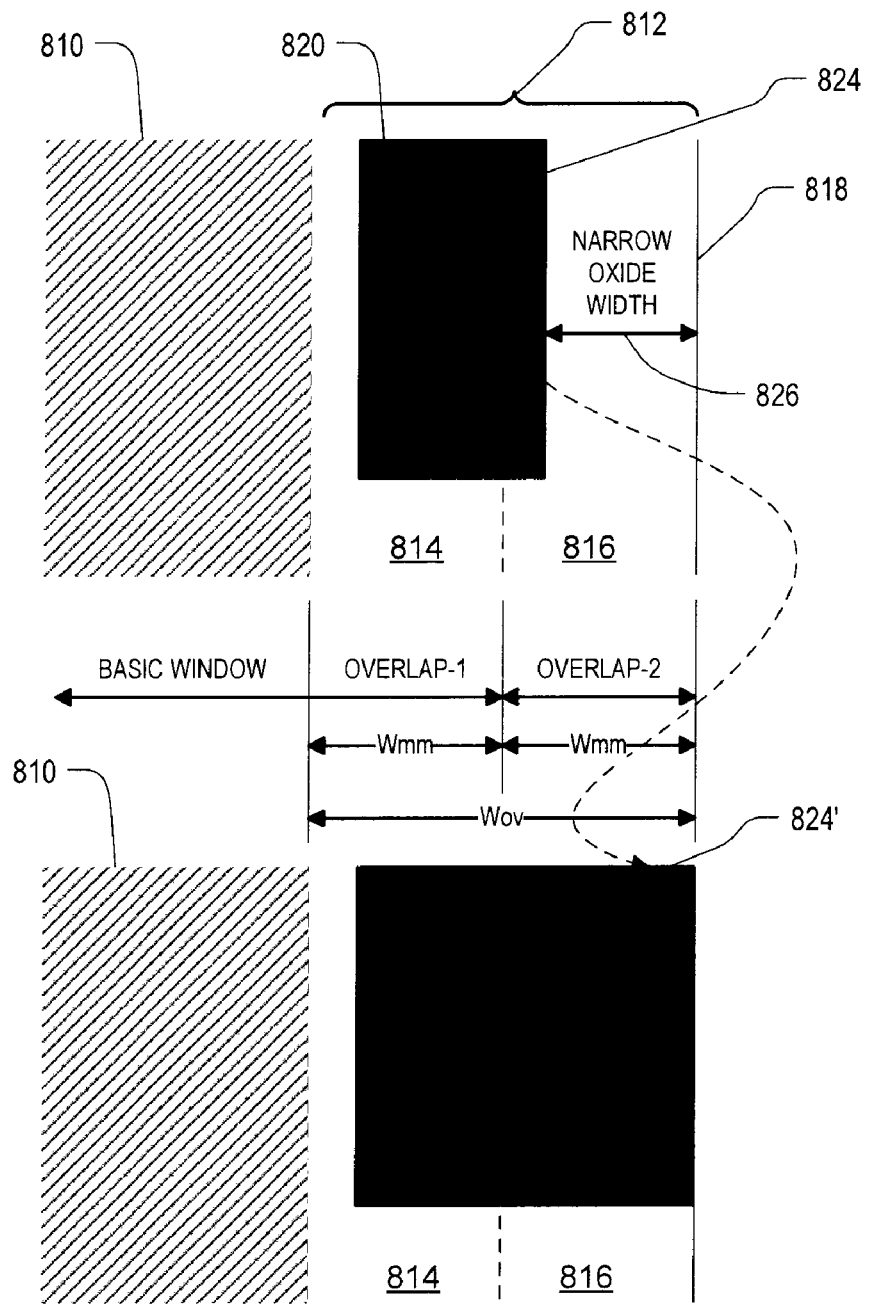
Figure 8C:
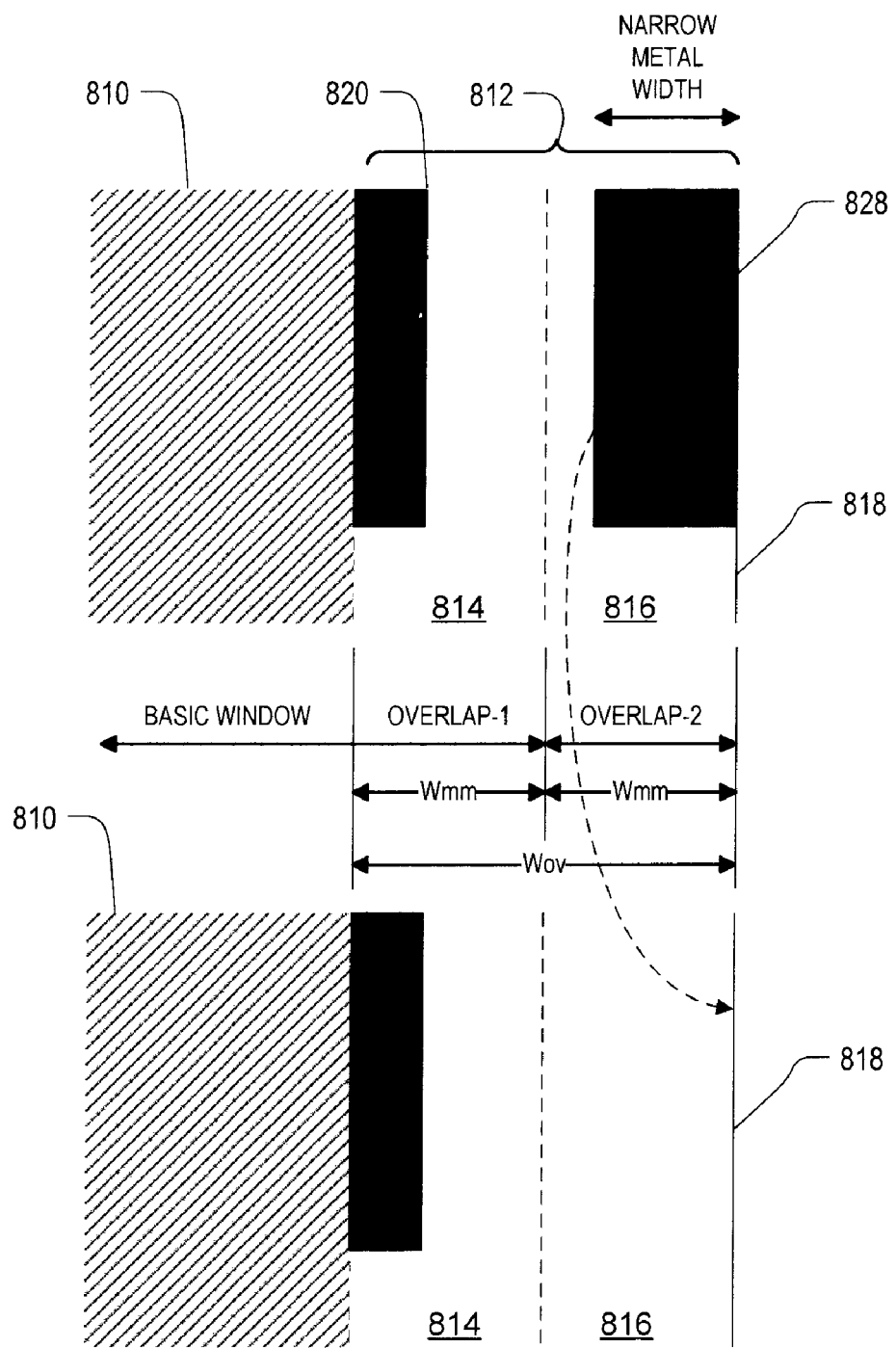

FIGS. 8A-8C illustrate this snapping step. In these figures, a right-hand edge of a basic window position 810 is shown enlarged. To the right of the basic window position 810 is the overlap region 812, which as previously mentioned has a width Wov=2Wmm. The overlap region 812 is shown divided into an overlap-1 portion 814, having a width of one Wmm and being located immediately adjacent to the basic window position 810, and an overlap-2 portion 816, also having a width of one Wmm and being located immediately adjacent to the outer edge 818 of the overlap region. Metal regions are shown in black.

Initially, FIG. 8A illustrates two geometric configurations which are acceptable as is, and will not be snapped. Specifically, metal region 820 is not narrower than Wmm because it continues toward the left into the basic window (assuming technology layout rules were followed). The oxide width to the right of metal region 820 is also not narrower than Wmm because it is wider than the width of the overlap-2 region 816. Similarly, metal region 822 is not narrower than Wmm because it is wider than the width of the overlap-2 region 816, and the oxide region to its left is also not narrower than Wmm because it continues toward the left into the basic window (again assuming technology layout rules were followed). Accordingly, the geometries shown in FIG. 8A will not introduce artifacts and can remain in place for the purpose of the 2-dimensional analysis.

FIG. 8B, on the other hand, illustrates a geometry configuration which can introduce artifacts. The top half of FIG. 8B shows the arrangement as provided in the layout database, and the bottom half shows the arrangement as modified to correct the problem. Referring to the top half, a metal region 824 terminates on the right at a position within the overlap-2 region, leaving an oxide width 826 that is narrower than the minimum metal line width Wmm. To correct this, the system repositions the right-hand edge of metal region 824 out to the outer edge 818 of the overlap region 812 for purposes of the 2-dimensional analysis of basic window 810. As shown in the bottom half of FIG. 8B the resulting metal region 824' is wider than Wmm, and the narrow oxide region 826 has been eliminated.

Similarly, FIG. 8C illustrates another geometry configuration which can introduce artifacts. Again, the top half of FIG. 8C shows the arrangement as provided in the layout database, and the bottom half shows the arrangement as modified to correct the problem. Referring to the top half, a metal region 828 starts on its left at a position within the overlap-2 region, giving it a width that is narrower than the minimum metal line width Wmm. To correct this, the system repositions the left-hand edge of metal region 828 out to the outer edge 818 of the overlap region 812 for purposes of the 2-dimensional analysis. As shown in the bottom half of FIG. 8C this results in eliminating the narrow metal region 828 altogether for purposes of the 2-dimensional analysis of basic window 810.

Note that in both cases of FIGS. 8B and 8C the edges of the metal regions 824 and 828 are repositioned only for purposes of the 2-dimensional analysis of the particular basic window position 810. They are returned to their original positions for analysis of the next basic window position, immediately to the right. For that basic window position the metal regions 824 and 826 are inside the basic window itself and therefore will not be snapped. Instead they will be considered for the stress effects they introduce. The snapping step 520 therefore does not prevent these metal regions from being considered at all.

It can be seen that assuming technology layout rules were followed in upstream processing of the circuit design, it is not possible in most cases for geometry to appear which is narrower than the minimum metal line width Wmm. Narrower geometry can arise only in configurations in which, due to the arbitrary position of the outer edges of the overlap regions, geometry that begins less than one Wmm inside the outer edge of the overlap region is cut off by the outer edge. Accordingly, in order to avoid numerical artifacts, in step 520, only those metal edges that either begin or end within the outer minimum metal line width Wmm of the overlap region, are repositioned to the outer edge of the overlap region. In the embodiment of FIGS. 8A-8C, where the overlap width Wov was chosen to be twice the minimum metal line width, this means that only those metal edges that either begin or end within the outer half of the overlap region, are repositioned to the outer edge of the overlap region. But in other embodiments, where the width Wov of the overlap region is not so cleanly related to the minimum metal line width, the prior formulation of the rule applies: only those metal edges that either begin or end within the outer minimum metal line width Wmm of the overlap region, are repositioned to the outer edge of the overlap region.

Returning to FIG. 5, after metal edges in the overlap regions have been repositioned, in step 521 a 2-dimensional polygon mesh is imposed on the layer geometry as modified. Preferably a variable density polygon mesh is used, which has greater density near edges of the layer geometry than far from any edges. For example, for the layer portion in FIG. 4, the mesh preferably has higher polygon density near the edges of each of the metal traces than deeply within them or deeply within the white areas. The variable density can be determined either manually or automatically or both in combination. Also, preferably, the polygons are arranged so that only edges of the polygons lie on material boundaries; that is, none of the polygons should cross over a boundary between two materials. In this way, none of the polygons will be subject to the material properties of more than one material.

In step 522 the system sets up and solves the 2-dimensional simultaneous partial differential equations for all mesh polygons (either triangles or rectangles) in the current expanded window. Any conventional or yet-to-be-developed method can be used for this step. The following descriptions briefly describe one finite element method that is often used in the art.

(1) Establish nodal displacements at mesh points as unknowns, $u^m$.

(2) Express displacements at any point inside a mesh polygon element in terms of these unknowns through a set of interpolation functions, such as: $u = N\, u^m$.

(3) Express strains within the element in terms of the displacements, such as: $\epsilon_{ij} = (u_{i,j} + u_{j,i})/2$. Substitution for the displacement expression from (2) results in a relationship between strains in the element and the nodal displacements.

(4) Express element stresses in terms of element strains based on the material constitutive laws. When linear elasticity theory is employed, the material laws can be expressed as:

$\sigma_{ij}=c_{ijkl}\epsilon_{kl}$. Here the components of $C_{ijkl}$ are made of material properties such as Young's modulus, for the material of the respective polygon element as defined in the layer geometry. Using the expressions for element strains from (3) the element stresses can be expressed in terms of nodal displacements.

(5) Consider now the equilibrium of an element. The equilibrium equations $\sigma_{ij,j}=0$ can be derived by minimization of the total potential energy which leads to satisfaction of principle of virtual work. Substituting for element stresses and strains from (3) and (4) into the principle of virtual work expressions, the element equilibrium is now expressed in terms of a set of linear equations. The unknowns of the equations are the nodal displacements, and the coefficients of the equations form the element stiffness matrix. The nodal forces form the load vector on the right hand side.

(6) Now consider the global equilibrium for the entire current expanded window region. The global equilibrium is established by summation over all the element equilibrium equations in the region. The summation is performed based on element connectivity. After assembly of the element stiffness matrices and load vectors into a global stiffness matrix and load vector, the global equilibrium is now expressed in terms of a large set of linear equations where the unknowns are all the nodal displacements as defined in (1).

(7) Proper initial and boundary conditions are applied in a known manner to determine the global load vector, and the stiffness matrix is evaluated using the material properties of the respective material as defined in the layer geometry. The large set of linear equations is then solved numerically for the nodal displacements on the mesh points.

(8) Evaluations are then performed to obtain element strains and stresses using (3) and (4).

Although stresses are calculated for polygons located in the overlap regions of the current window as well as for polygons located within the basic window position, those in the overlap regions are now discarded.

In step 526, from the 2-dimensional stress components, principle stress values are calculated for each mesh polygon in the current window position. The first principle stress is a scalar value which can be thought of as representing the maximum overall stress acting on the polygon; it is a single value which, though it does not necessarily approximate the actual 3-dimensional stress, nevertheless can be compared in magnitude to that of other polygons to rank them in order of highest to lowest stress. In another embodiment a different mechanism can be used to derive a single stress value per polygon for comparison.

In step 528, in order to smooth out variations from individual polygons, the system averages the first principle stress value for each polygon in the current window position with that of nearby polygons. The nearby polygons are determined based on an "averaging region" for the subject polygon. The averaging region can in one embodiment be defined as all mesh polygons within a radius r of the centroid of the subject polygon, or in another embodiment they can be defined as all mesh polygons within a square centered at the centroid of the subject polygon, and having a length 2 r on a side. The length r is independent of the size of the nearby polygons themselves, and in a particular embodiment may be chosen to be equal to the minimum metal line width for the layer. The first principle stress values for the subject and nearby polygons are averaged together in a weighted average, the weighting for each polygon being proportional to its area. In one embodiment, if a particular polygon is only partially within the averaging region, then that polygon's first principle value is included in the average but it is weighted in proportion to only that part of the polygon's area that is within the averaging region. In another, more preferred, embodiment, if a particular polygon is only partially within the averaging region, then that polygon's first principle value is included in the average only if that polygon's centroid is within the averaging region. If it is included, then it is weighted in proportion to its full area. This second embodiment is preferred because it reduces computation time without significantly impairing accuracy.

Figure 9:
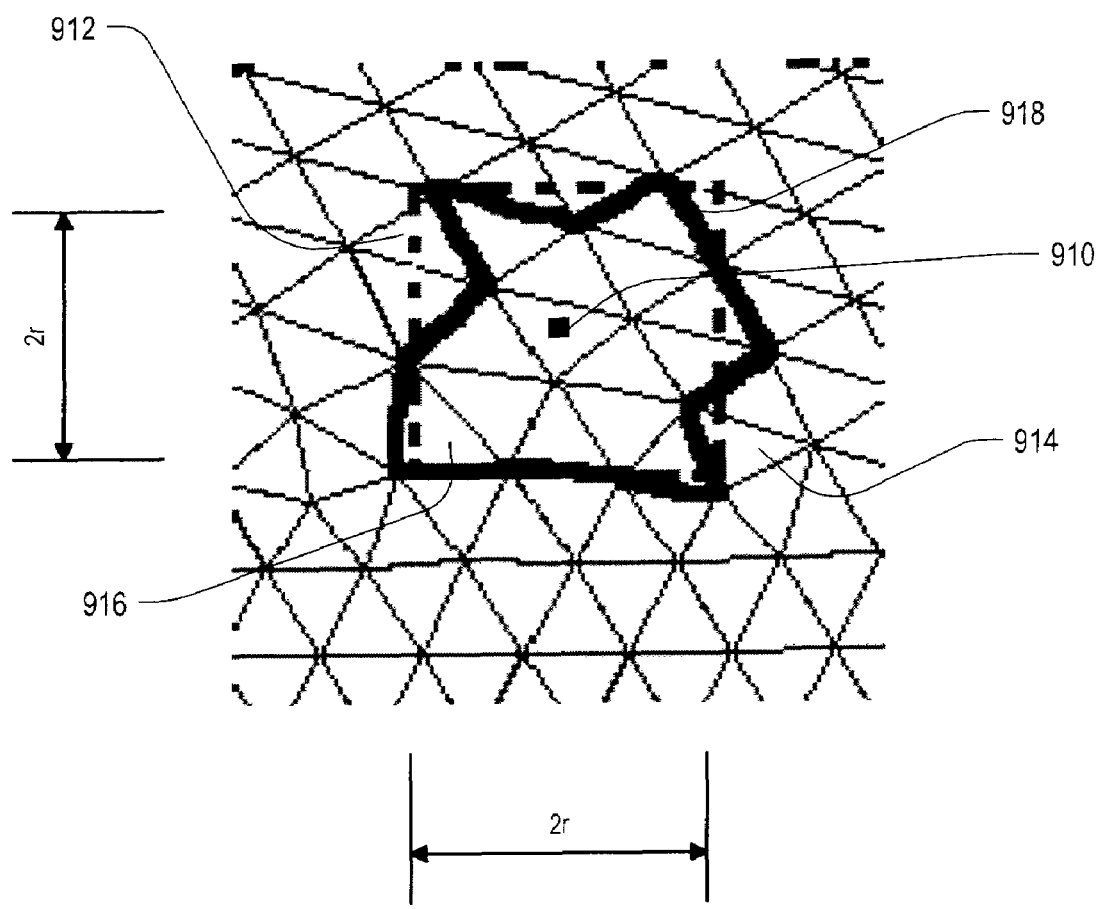
FIG. 9 illustrates a portion of a 2-dimensional polygon mesh for use in a 2-dimensional stress analysis.

FIG. 9 illustrates the operation of this second averaging embodiment. FIG. 9 shows a small region of the variable density polygon mesh for a particular one of the interconnect layers. It is desired to calculate an average principle stress value for the subject triangle whose centroid is denoted 910 in the figure. First, an averaging region is drawn, as a square of length 2 r on a side, centered at point 910. The square is shown in the figure as dashed line 912. Next, it is determined which triangles are "nearby enough" to be included in the average for the subject triangle. In FIG. 9 it can be seen that several triangles (including the subject triangle) are wholly within the square, and those triangles will be included in the average and weighted in proportion to their full area. Several other triangles, for example triangles 914 and 916, are partially within the square and partially without. Those triangles whose centroid is located outside the square, such as triangle 914, are excluded from the average, whereas those triangles whose centroid is located inside the square, such as triangle 916, are included in the average. Those that are included are weighted in proportion to their full area, including the portion of the triangle that lies outside the square, based on an assumption that the total area of partial triangle that will be excluded from the average roughly equals the total area of partial triangles that will be included in the average. The heavy black line 918 thus indicates the shape of the region where stress is actually averaged in this example, and while it is not square, its area should be roughly equal to the area of the square 912.

After averaging, and regardless of the averaging method used, the average value calculated for each of the polygons in the mesh is then stored as the 2-dimensional stress value associated with that polygon. This is the value that is used in step 318 (FIG. 3) for selecting high-stress planar regions.

In step 530, if there are more windows to step through in the current layer, the system returns to step 516 to step the window position. Otherwise, the 2-dimensional analysis of the current layout layer is complete.

Alternative to the embodiment depicted in FIG. 5, another implementation imposes the 2-dimensional mesh only once over the entire layer, so step 521 in FIG. 5 is called sometime prior to step 516. Also, steps 526 and 528 can be performed after step 530 in some embodiments.

Analyzing 3-Dimensional Stress

Figure 10:
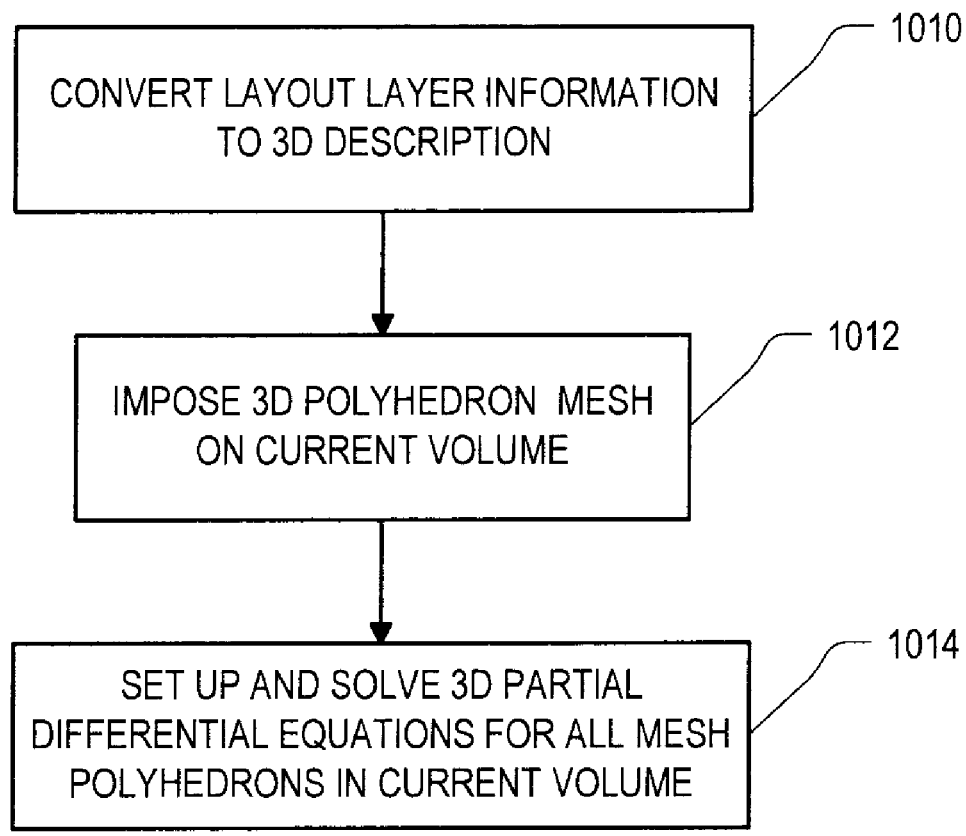
FIG. 10 is a flow chart detail of the step in FIG. 3 for analyzing 3-dimensional stress.

The step 326 in FIG. 3, for analyzing the 3-dimensional stress in the current volumetric region, can be performed using any conventional or yet-to-be-developed method. Since the regions are small and their number has been limited by the 2-dimensional filtering above, a full-fledged finite element analysis can be used. Windowing is usually not necessary here, although it may still be used in a particular embodiment. Windowing would be volumetric in step 326, rather than planar. Many techniques for performing the 3-dimensional analysis are well known, but for completeness an embodiment is described briefly herein. FIG. 10 is a flow chart illustrating the overall flow of this step.

In step 1010, the portion of the layout layer information that bears on the current volume is converted into a 3-dimensional description of structures within the current volume. This conversion takes into account the 2-dimensional shapes and sizes of elements in each of the layout layers that affect the structures that will ultimately be formed in the current volume, including layers other than interconnect layers and via layers. It also takes into account the process steps that will be used to form and pattern the layers, and the properties of the particular materials that will be used. In this way the thickness (depth) of each layer in the z-direction can be estimated. In an embodiment this information is also used to estimate the sloping of any sidewalls, feature undercutting, and so on. Alternatively, layer thickness information can be entered manually.

In step 1012 a 3-dimensional polyhedron mesh is imposed on the current volume. Preferably the mesh has variable density, with the mesh increasing in polyhedron density near corners and walls of the 3-dimensional structure. The variable density mesh can be created manually or automatically based on the 3-dimensional description developed in step 1010.

In step 1014 the system sets up and solves the 3-dimensional simultaneous partial differential equations for all mesh polyhedrons in the current volume. As with the 2-dimensional analysis in step 314, any conventional or yet-to-be-developed method can be used for this step, and in an embodiment the method can be similar to that set forth above for the 2-dimensional analysis.

The 3-dimensional description developed in step 1010 is set up for numerical solution for this system of equations with proper boundary conditions, again taking into account the stress propagation characteristics of the particular materials to be used. The system of equations is then solved numerically, yielding values for the six 3-dimensional stress components, $\sigma xx$, $\sigma xy$, $\sigma xz$, $\sigma yy$, $\sigma yz$, and $\sigma zz$ for each polyhedron in the mesh.

Hardware Environment

Figure 11:
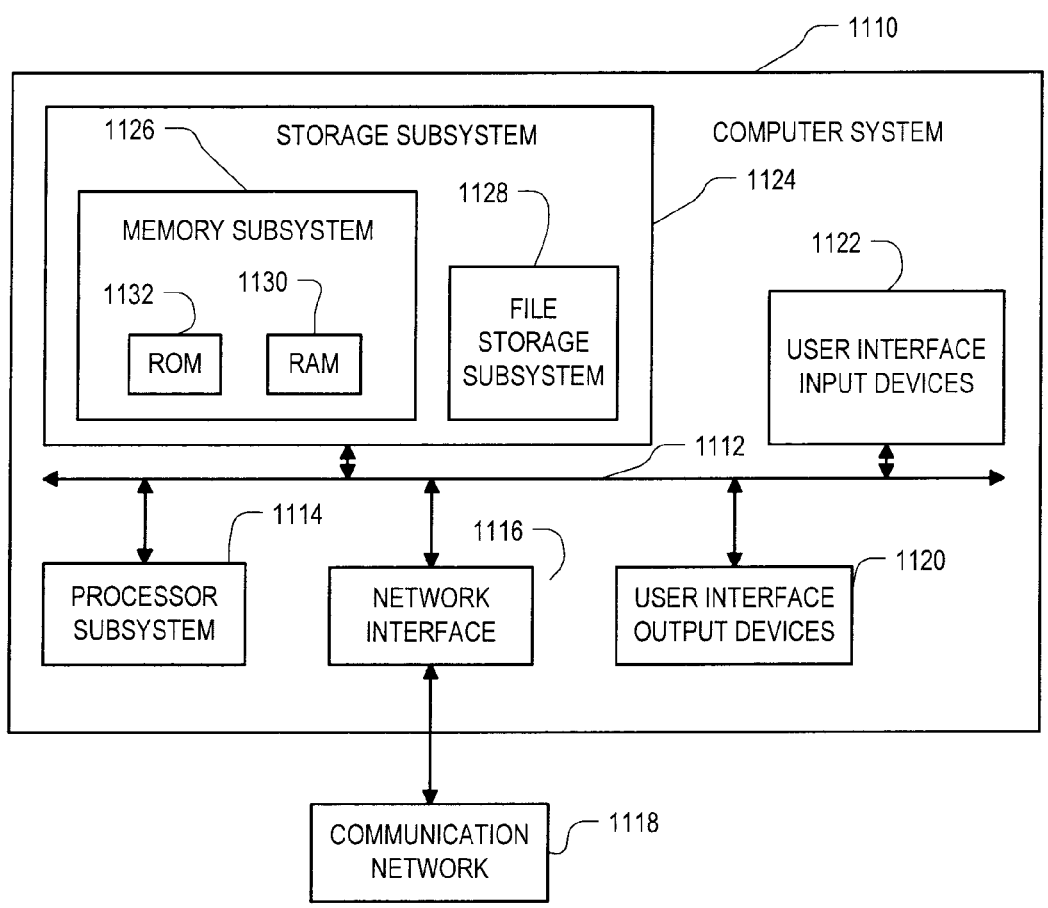
FIG. 11 is a simplified block diagram of a computer system that can be used to implement software incorporating aspects of the present invention.

FIG. 11 is a simplified block diagram of a computer system 1110 that can be used to implement software incorporating aspects of the present invention. Computer system 1110 typically includes a processor subsystem 1114 which communicates with a number of peripheral devices via bus subsystem 1112. These peripheral devices may include a storage subsystem 1124, comprising a memory subsystem 1126 and a file storage subsystem 1128, user interface input devices 1122, user interface output devices 1120, and a network interface subsystem 1116. The input and output devices allow user interaction with computer system 1110. Network interface subsystem 1116 provides an interface to outside networks, including an interface to communication network 1118, and is coupled via communication network 1118 to corresponding interface devices in other computer systems. Communication network 1118 may comprise many interconnected computer systems and communication links. These communication links may be wireline links, optical links, wireless links, or any other mechanisms for communication of information. While in one embodiment, communication network 1118 is the Internet, in other embodiments, communication network 1118 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 1122 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 1110 or onto computer network 1118.

User interface output devices 1120 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 1110 to the user or to another machine or computer system.

Storage subsystem 1124 stores the basic programming and data constructs that provide the functionality of certain embodiments of the present invention. For example, the various modules implementing the functionality of certain embodiments of the invention may be stored in storage subsystem 1124. These software modules are generally executed by processor subsystem 1114.

Memory subsystem 926 typically includes a number of memories including a main random access memory (RAM) 930 for storage of instructions and data during program execution and a read only memory (ROM) 932 in which fixed instructions are stored. File storage subsystem 928 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 928. The host memory 926 contains, among other things, computer instructions which, when executed by the processor subsystem 914, cause the computer system to operate or perform functions as described herein. As used herein, processes and software that are said to run in or on "the host" or "the computer", execute on the processor subsystem 914 in response to computer instructions and data in the host memory subsystem 926 including any other local or remote storage for such instructions and data.

Bus subsystem 1112 provides a mechanism for letting the various components and subsystems of computer system 1110 communicate with each other as intended. Although bus subsystem 1112 is shown schematically as a single bus, alternative embodiments of the bus subsystem may use multiple busses.

Computer system 1110 itself can be of varying types including a personal computer, a portable computer, a workstation, a computer terminal, a network computer, a television, a mainframe, or any other data processing system or user device. Due to the ever-changing nature of computers and networks, the description of computer system 1110 depicted in FIG. 11 is intended only as a specific example for purposes of illustrating the preferred embodiments of the present invention. Many other configurations of computer system 1110 are possible having more or less components than the computer system depicted in FIG. 11.

As used herein, a given event or value is "responsive" to a predecessor event or value if the predecessor event or value influenced the given signal, event or value. If there is an intervening processing element, step or time period, the given event or value can still be "responsive" to the predecessor signal, event or value. If the intervening processing element or step combines more than one signal, event or value, the signal output of the processing element or step is considered "responsive" to each of the event or value inputs. If the given event or value is the same as the predecessor signal, event or value, this is merely a degenerate case in which the given event or value is still considered to be "responsive" to the predecessor signal, event or value. "Dependency" of a given event or value upon another event or value is defined similarly.

While the present invention is disclosed by reference to the preferred embodiments and examples detailed above, it is understood that these examples are intended in an illustrative rather than in a limiting sense. Computer-assisted processing is implicated in the described embodiments. Accordingly, the present invention may be embodied in methods for predicting high-stress volumetric regions in an integrated circuit structure, systems including logic and resources to carry out the prediction of high-stress volumetric regions in an integrated circuit structure, systems that take advantage of computer-assisted methods for performing such prediction, media impressed with logic to carry out methods for performing such prediction, data streams impressed with logic to carry out methods for performing such prediction, or computer-accessible services that carry out computer-assisted methods for performing such prediction.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A method for predicting high-stress volumetric regions in an integrated circuit structure having a plurality of layers each corresponding to a respective layout layer in a layout of an integrated circuit design, for use with a computer system having a processor and a memory, comprising the steps of:
the computer system 2-dimensionally analyzing mechanical stress in a plurality of 2-dimensional regions of a first one of the layout layers;
the computer system selecting a first one of the regions in the plurality of regions, in dependence upon the stress predicted in the step of 2-dimensionally analyzing;
the computer system identifying a first volumetric region of the integrated circuit design in dependence upon the region selected in the step of selecting; and
the computer system 3-dimensionally analyzing mechanical stress in the first volumetric region.

2. A method according to claim 1, wherein the first layout layer corresponds to a first interconnect layer of the integrated circuit design.

3. A method according to claim 2, wherein the first volumetric region includes the first interconnect layer and at least a second interconnect layer of the integrated circuit design.

4. A method according to claim 1, wherein the first volumetric region includes at least lower, intermediate, and upper interconnect layers of the integrated circuit design, the intermediate interconnect layer corresponding to the first layout layer.

5. A method according to claim 1, further comprising the steps of:

2-dimensionally analyzing mechanical stress in a second plurality of 2-dimensional regions of a second one of the layout layers;
selecting a subset of the regions in the second plurality of regions, in dependence upon the stress predicted in the step of 2-dimensionally analyzing mechanical stress in a second plurality of regions;
identifying a set of volumetric regions of the integrated circuit design in dependence upon the regions selected in the step of selecting a subset of the regions in the second plurality; and
3-dimensionally analyzing mechanical stress in the volumetric region in each of the set of volumetric regions.

6. A method according to claim 1, wherein the step of the computer system 2-dimensionally analyzing comprises the steps of:
defining a 2-dimensional analysis window smaller than the first layout layer;
iteratively shifting the analysis window across the first layout layer; and
at each iteration, the computer system 2-dimensionally analyzing mechanical stress in only a respective subset of the 2-dimensional regions of the first layout layer, the respective subsets being dependent upon the position of the analysis window at the current iteration.

7. A method according to claim 6, wherein the 2-dimensional analysis window comprises a basic analysis window and an overlap region bordering but outside the basic analysis window,
wherein the step of iteratively shifting is such that after each iteration, the position of the basic analysis window on the first layout layer is adjacent to the position of the basic analysis window after another one of the iterations,
and wherein the subset of 2-dimensional regions of the first layout layer analyzed at each one of the iterations includes 2-dimensional regions outside the basic analysis window but within the overlap region.

8. A method according to claim 6, wherein the first layout layer corresponds to a first interconnect layer of the integrated circuit design, and wherein the first interconnect layer has associated therewith a minimum metal line width, further comprising the steps, for a particular one of the iterations, of:
identifying a metal region specified by the first layout layer to have a metal edge that is inside the analysis window but closer than the minimum metal line width to a window edge to which the metal edge is parallel; and
modifying the shape of the metal region, at least for purposes of the step of thye computer system 2-dimensionally analyzing mechanical stress in only the subset of regions corresponding to the particular iteration, so as to relocate the metal edge to be coincident with the window edge.

9. A method for predicting high-stress volumetric regions in an integrated circuit structure having a plurality of layers each corresponding to a respective layout layer in a layout of an integrated circuit design, for use with a computer system having a processor and a memory, comprising the steps of:
the computer system two-dimensionally analyzing mechanical stress in a plurality of 2-dimensional regions of at least one of the layout layers;
the computer system selecting a subset of the regions in the plurality of regions, in dependence upon the stress predicted in the step of two-dimensionally analyzing;
the computer system identifying a set of volumetric regions of the integrated circuit design in dependence upon the subset of regions selected in the step of selecting; and the computer system three-dimensionally analyzing mechanical stress in each of the volumetric regions in the set.

10. A method according to claim 9, wherein the set of volumetric regions includes first and second volumetric regions, further comprising the step of combining at least the first and second volumetric regions for purposes of the step of three-dimensionally analyzing.

11. A computer program product for predicting high-stress volumetric regions in an integrated circuit structure having a plurality of layers each corresponding to a respective layout layer in a layout of an integrated circuit design, the computer program product comprising a computer readable medium having stored thereon a plurality of software code portions which when executed by a processor perform the steps of:
2-dimensionally analyzing mechanical stress in a plurality of 2-dimensional regions of a first one of the layout layers;
selecting a first one of the regions in the plurality of regions, in dependence upon the stress predicted in the step of 2-dimensionally analyzing;
identifying a first volumetric region of the integrated circuit design in dependence upon the region selected in the step of selecting; and
3-dimensionally analyzing mechanical stress in the first volumetric region.

12. A product according to claim 11, wherein the first layout layer corresponds to a first interconnect layer of the integrated circuit design.

13. A product according to claim 11, wherein the first volumetric region includes at least lower, intermediate, and upper interconnect layers of the integrated circuit design, the intermediate interconnect layer corresponding to the first layout layer.

14. A product according to claim 11, wherein the software code portions when executed by the processor perform the further steps of:
2-dimensionally analyzing mechanical stress in a second plurality of 2-dimensional regions of a second one of the layout layers;
selecting a subset of the regions in the second plurality of regions, in dependence upon the stress predicted in response to the 2-dimensional analysis of mechanical stress in a second plurality of regions;
identifying a set of volumetric regions of the integrated circuit design in dependence upon the regions selected in the second plurality of regions; and
3-dimensionally analyzing mechanical stress in each of the volumetric region in the set of volumetric regions.

15. A product according to claim 11, wherein the software code portions for 2-dimensionally analyzing comprise software code portions which when executed by the processor perform the steps of:
defining a 2-dimensional analysis window smaller than the first layout layer;
iteratively shifting the analysis window across the first layout layer; and
at each iteration, 2-dimensionally analyzing mechanical stress in only a respective subset of the 2-dimensional regions of the first layout layer, the respective subsets being dependent upon the position of the analysis window at the current iteration.

16. A product according to claim 15, wherein the 2-dimensional analysis window comprises a basic analysis window and an overlap region bordering but outside the basic analysis window,
wherein the software code portions for iteratively shifting are such that after each iteration, the position of the basic analysis window on the first layout layer is adjacent to the position of the basic analysis window after another one of the iterations,
and wherein the subset of 2-dimensional regions of the first layout layer analyzed at each one of the iterations includes 2-dimensional regions outside the basic analysis window but within the overlap region.

17. A product according to claim 11, wherein the first layout layer corresponds to a first interconnect layer of the integrated circuit design, and wherein the first interconnect layer has associated therewith a minimum metal line width, wherein with respect to a particular one of the iterations the software code portions when executed by the processor perform the further steps of:
identifying a metal region specified by the first layout layer to have a metal edge that is inside the analysis window but closer than the minimum metal line width to a window edge to which the metal edge is parallel; and
modifying the shape of the metal region, at least for purposes of the code for 2-dimensionally analyzing mechanical stress in only the subset of regions corresponding to the particular iteration, so as to relocate the metal edge to be coincident with the window edge.

18. A system for predicting high-stress volumetric regions in an integrated circuit structure having a plurality of layers each corresponding to a respective layout layer in a layout of an integrated circuit design, the system comprising:
a memory;
a data processor coupled to the memory, the data processor configured to:
2-dimensionally analyze mechanical stress in a plurality of 2-dimensional regions of a first one of the layout layers;
select a first one of the regions in the plurality of regions, in dependence upon the stress predicted in the step of 2-dimensionally analyzing;
identify a first volumetric region of the integrated circuit design in dependence upon the region selected in the step of selecting; and
3-dimensionally analyze mechanical stress in the first volumetric region.

19. A system according to claim 18, wherein the first layout layer corresponds to a first interconnect layer of the integrated circuit design.

20. A system according to claim 18, wherein the first volumetric region includes the first interconnect layer and at least a second interconnect layer of the integrated circuit design.

21. A system according to claim 18, wherein the data processor is configured further to:
2-dimensionally analyze mechanical stress in a second plurality of 2-dimensional regions of a second one of the layout layers;
select a subset of the regions in the second plurality of regions, in dependence upon the stress predicted in the step of 2-dimensionally analyzing mechanical stress in a second plurality of regions;
identify a set of volumetric regions of the integrated circuit design in dependence upon the regions selected in the step of selecting a subset of the regions in the second plurality; and
3-dimensionally analyze mechanical stress in the volumetric region in each of the set of volumetric regions.

22. A system according to claim 18, wherein the data processor is configured further such that in the step of 2-dimensionally analyzing comprises the data processor:
- defines a 2-dimensional analysis window smaller than the first layout layer;
- iteratively shifts the analysis window across the first layout layer; and
- at each iteration, 2-dimensionally analyzes mechanical stress in only a respective subset of the 2-dimensional regions of the first layout layer, the respective subsets being dependent upon the position of the analysis window at the current iteration.

23. A system according to claim 22, wherein the 2-dimensional analysis window comprises a basic analysis window and an overlap region bordering but outside the basic analysis window,
- wherein the data processor is configured farther such that after each iteration in the step of iteratively shifting, the position of the basic analysis window on the first layout layer is adjacent to the position of the basic analysis window after another one of the iterations,
- and wherein the data processor is configured farther such that the subset of 2-dimensional regions of the first layout layer analyzed at each one of the iterations includes 2-dimensional regions outside the basic analysis window but within the overlap region.

24. A system according to claim 22, wherein the first layout layer corresponds to a first interconnect layer of the integrated circuit design, and wherein the first interconnect layer has associated therewith a minimum metal line width, and wherein the data processor is configured further such that, for a particular one of the iterations the data processor:
- identifies a metal region specified by the first layout layer to have a metal edge that is inside the analysis window but closer than the minimum metal line width to a window edge to which the metal edge is parallel; and
- modifies the shape of the metal region, at least for purposes of the step of 2-dimensionally analyzing mechanical stress in only the subset of regions corresponding to the particular iteration, so as to relocate the metal edge to be coincident with the window edge.

* * * * *